United States Patent
Sai (10) Patent No.: US 8,467,758 B2
(45) Date of Patent: Jun. 18, 2013

(54) FREQUENCY TUNING CIRCUIT, PHASE-LOCKED LOOP CIRCUIT, COMMUNICATION APPARATUS, AND STORAGE APPARATUS

(75) Inventor: Akihide Sai, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/409,597

(22) Filed: Mar. 1, 2012

(65) Prior Publication Data

US 2013/0051437 A1    Feb. 28, 2013

(30) Foreign Application Priority Data

Aug. 24, 2011   (JP) .................................. 2011-182920

(51) Int. Cl.
*H04B 1/06*    (2006.01)

(52) U.S. Cl.
USPC ................. 455/260; 455/71; 455/76; 455/77; 455/165.1; 455/150.1; 455/183.1; 455/183.2; 331/16; 331/18; 331/34; 375/344; 375/219; 375/375; 375/327

(58) Field of Classification Search
USPC ................. 455/260, 71, 76, 77, 165.1, 150.1, 455/183.1, 183.2; 331/16, 18, 34; 375/344, 375/375, 219, 327
See application file for complete search history.

(56) References Cited

U.S. PATENT DOCUMENTS

| 6,710,664 B2 * | 3/2004 | Humphreys et al. ............ 331/11 |
| 7,095,992 B2 * | 8/2006 | Kim et al. .................. 455/180.3 |
| 8,248,167 B2 * | 8/2012 | Bolton ............................ 331/16 |

FOREIGN PATENT DOCUMENTS

JP           3717897 B2    11/2005

\* cited by examiner

*Primary Examiner* — Junpeng Chen
(74) *Attorney, Agent, or Firm* — Holtz, Holtz, Goodman & Chick, P.C.

(57) ABSTRACT

According to one embodiment, a register outputs a first control code in first and second operation modes, saves the first control code as a third control code at an end of the first operation mode, and outputs the third control code at a beginning of a third operation mode. In the first operation mode, a digital-to-analog converter supplies a control signal with a control voltage to a voltage controlled oscillator. In the second operation mode, the control signal is supplied to a buffer amplifier, the amplifier drives a bandlimiting filter, and the filter generates the control voltage. In the third operation mode, the control signal is supplied to the filter, and the filter generates the control voltage.

7 Claims, 7 Drawing Sheets

FREQUENCY TUNING CIRCUIT, PHASE-LOCKED LOOP CIRCUIT, COMMUNICATION APPARATUS, AND STORAGE APPARATUS

CROSS-REFERENCE TO RELATED APPLICATIONS

This application is based upon and claims the benefit of priority from prior Japanese Patent Application No. 2011-182920, filed Aug. 24, 2011, the entire contents of which are incorporated herein by reference.

FIELD

Embodiments described herein relate generally to a phase-locked loop (PLL).

BACKGROUND

A phase-locked loop (PLL) is sometimes formed using a ring oscillator with inverters annularly connected together. Ring oscillators are sensitive to disturbance, and thus a bandlimiting filter for narrow bands is provided in a frequency coarse-tuning circuit, a bias circuit, or the like in a PLL.

For example, such a PLL is expected to be incorporated into a system (or an apparatus) that intermittently operates a power source. In this case, the bandlimiting filter for narrow bands may increase lockup time following power-on. The increased lockup time prevents the data rate of the system from being improved.

DETAILED DESCRIPTION

Embodiments will be described below with reference to the drawings.

In general, according to one embodiment, a frequency tuning circuit supports a first operation mode, a second operation mode, and a third operation mode. The circuit comprises a voltage controlled oscillator, a digital frequency detector, a controller, a register, a digital-to-analog converter, a bandlimiting filter, a buffer amplifier and a switcher. The voltage controlled oscillator includes a first control terminal and outputs an oscillation signal which is controllable based on a first control voltage provided to the first control terminal. The digital frequency detector detects a frequency error between a reference signal and a target signal obtained by dividing a frequency of the oscillation signal at a desired rate. The controller adjusts a gain of the frequency error to generate a first digital control code. The register outputs the first digital control code as a second digital control code in the first operation mode and the second operation mode, saves the first digital control code as a third digital control code at an end of the first operation mode, and outputs the third digital control code as the second digital control code at a beginning of the third operation mode. The digital-to-analog converter converts the second digital control code into an analog control signal and outputs the analog control signal. The bandlimiting filter filters the analog control signal to generate the first control voltage when connected to the first control terminal of the voltage controlled oscillator. The buffer amplifier drives the bandlimiting filter when connected to the digital-to-analog converter and the bandlimiting filter. The switcher switches a state of connections among the digital-to-analog converter, the first control terminal of the voltage controlled oscillator, the bandlimiting filter, and the buffer amplifier. In the first operation mode, the digital-to-analog converter supplies the analog control signal with the first control voltage to the first control terminal of the voltage controlled oscillator. In the second operation mode, the digital-to-analog converter supplies the analog control signal to the buffer amplifier, the buffer amplifier drives the bandlimiting filter, and the bandlimiting filter generates the first control voltage. In the third operation mode, the digital-to-analog converter supplies the analog control signal to the bandlimiting filter, and the bandlimiting filter generates the first control voltage.

Elements that are identical or similar to those previously described are denoted by identical or similar reference numerals. Duplicate descriptions are basically omitted.

(First Embodiment)

Figure 1:
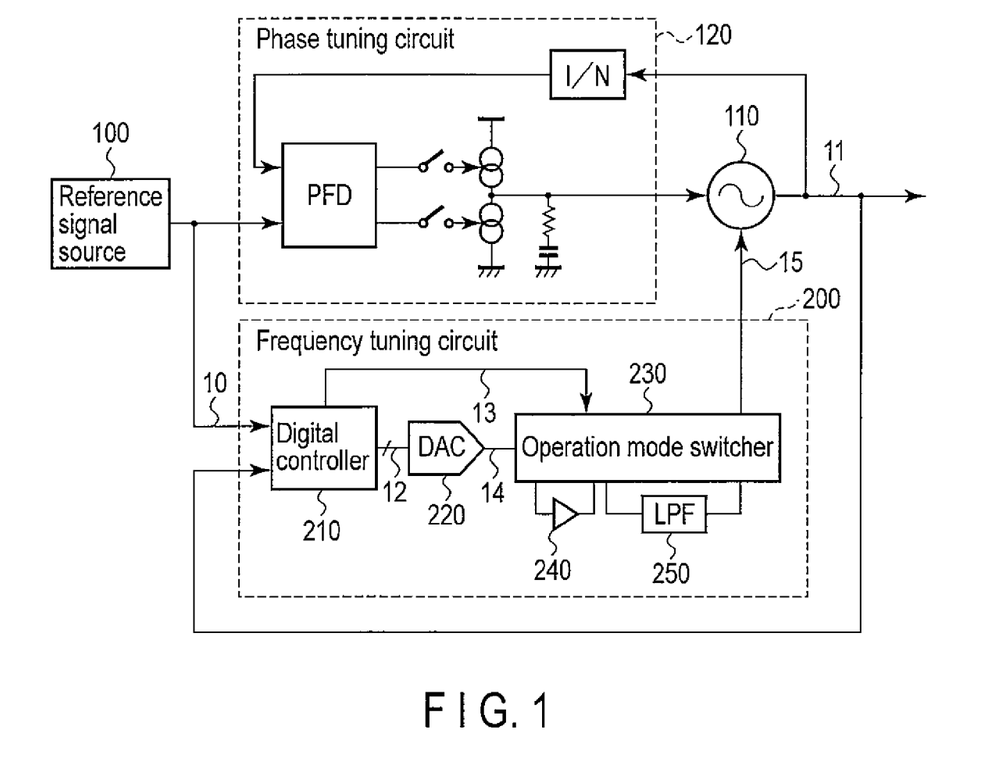
FIG. 1 is a block diagram illustrating a phase-locked loop circuit according to a first embodiment.

As shown in FIG. 1, a phase-locked loop circuit according to a first embodiment includes a reference signal source 100, a voltage controlled oscillator (VCO) 110, a phase tuning circuit 120, and a frequency tuning circuit 200.

The phase-locked loop circuit in FIG. 1 synchronizes the frequency and phase of a target signal obtained by dividing the frequency of an oscillation signal 11 output from the VCO 110 by N, with the frequency and phase of a reference signal 10 supplied by a reference signal source 100 (the synchronization is also referred to as locking). N denotes the frequency ratio of the reference signal to a desired signal. N may be an integer or may be a real number including an integer portion and a fractional portion. In the phase-locked loop circuit in FIG. 1, the frequency tuning circuit 200 generates a signal with a first control voltage 15 so that the frequency of the target signal is locked to the frequency of the reference signal 10. The phase tuning circuit 120 then generates a signal with a second control voltage so that the phase of the target signal is locked to the phase of the reference signal 10. The phase tuning circuit 120 and the frequency tuning circuit 200 may be referred to as a frequency fine-tuning circuit and a frequency coarse-tuning circuit, respectively.

The reference signal source 100 generates and supplies a reference signal 10 to the phase tuning circuit 120 and the frequency tuning circuit 200. The reference signal source 100 is implemented by, for example, a crystal oscillator.

The phase tuning circuit 120 is, for example, a charge pump PLL shown in FIG. 1. However, the present embodiment is not limited to this configuration. The phase tuning circuit 120 may by any circuit that can lock the phase of the target signal to the phase of the reference signal (or fine-tune the frequency of the target signal). The phase tuning circuit 120 receives the reference signal 10 from the reference signal source 100 and the oscillation signal 11 from the VCO 110. The phase tuning circuit 120 generates and supplies a signal with a second control voltage to a second control terminal of the VCO 110.

The VCO 110 generates and supplies an oscillation signal 11 to the phase tuning circuit 120 and the frequency tuning circuit 200. The frequency of the oscillation signal 11 is controlled by the first control voltage 15 provided to a first control terminal by the frequency tuning circuit 200 and the second control voltage provided to the second control terminal by the phase tuning circuit 120. In the description below, the VCO 110 is assumed to be a ring oscillator that is sensitive to disturbance. However, of course, the VCO 110 may be replaced with another type of voltage controlled oscillator. Moreover, the VCO 110 may be replaced with a current-controlled oscillator (CCO). However, a control current for the CCO is finally converted into a control voltage, and thus a combination of a current-voltage converter and the CCO may be considered to be a type of VCO 110.

As shown in FIG. 1, the frequency tuning circuit 200 includes a digital controller 210, digital-to-analog converter (DAC) 220, an operation mode switcher 230, a buffer amplifier 240, and a bandlimiting filter 250. The frequency tuning circuit 200 receives the reference signal 10 from the reference signal source 100 and the oscillation signal 11 from the VCO 110. The frequency tuning circuit 200 generates and supplies a signal with the first control voltage 15 to the first control terminal of the VCO 110.

Figure 2:
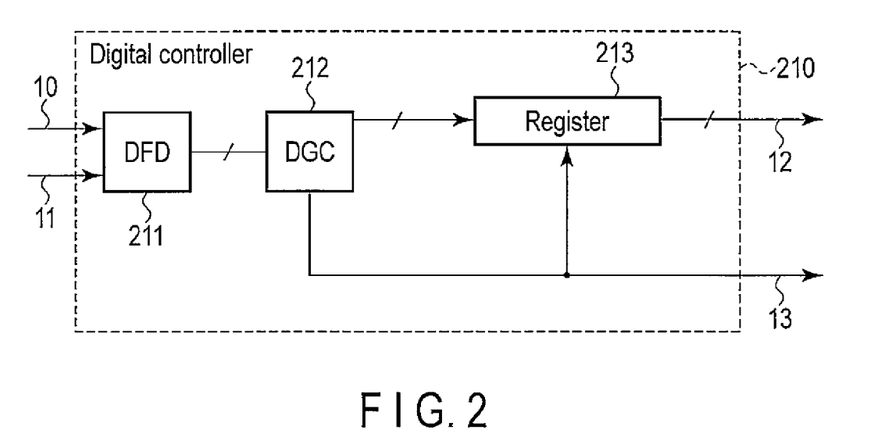
FIG. 2 is a block diagram illustrating a digital controller shown in FIG. 1.

The digital controller 210 generates a digital control code 12 based on a frequency error between the target signal and the reference signal 10. The digital controller 210 also generates an operation mode switching signal 13 indicative of switching of the operation mode of the frequency tuning circuit 200 described below. More specifically, as shown in FIG. 2, the digital controller 210 includes a digital frequency detector 211, a digital gain controller 212, and a register 213.

The digital frequency detector 211 detects the frequency error between the target signal and the reference signal 10 to output a digital signal corresponding to the frequency error. The digital frequency detector 211 can derive the target signal from the oscillation signal 11. The digital gain controller 212 adjusts the gain of the digital signal from the digital frequency detector 211 to generate a digital control code. The digital gain controller 212 supplies the digital control code to the register 213. Moreover, the digital gain controller 212 controls the operation mode of the frequency tuning circuit 200. Specifically, the digital gain controller 212 supplies the operation mode switching signal 13 to the register 213 and the operation mode switcher 230.

The register 213 basically outputs the digital control code from the digital gain controller 212 as the digital control code 12 without any change. However, at the end of a first operation mode described below, the digital control code output by the digital gain controller 212 is saved to the register 213. Moreover, at the beginning of a third operation mode described below, the register 213 outputs the digital control code saved at the end of the preceding first operation mode, as the digital control code 12. The register 213 can detect switching of the operation mode through the operation mode switching signal 13.

The DAC 220 performs a digital-to-analog conversion to convert the digital control code 12 from the digital controller 210 into an analog control signal 14. The analog control signal 14 has a control voltage corresponding to the digital control mode 12. The DAC 220 supplies the analog control signal 14 to the operation mode switcher 230.

The operation mode switcher 230 detects switching of the operation mode based on the operation mode switching signal 13. Then, according to the detected operation mode, the operation mode switcher 230 switches the state of the connections among an output terminal of the DAC 220, the buffer amplifier 240, the bandlimiting filter 250, and the first control terminal of the VCO 110. The operation mode switcher 230 will be described below in detail. In all the operation modes, the operation mode switcher 230 supplies a signal with the first control voltage 15 to the first control terminal of the VCO 110.

The buffer amplifier 240 is connected to the operation mode switcher 230. More specifically, the buffer amplifier 240 may or may not be connected to DAC 200 and the bandlimiting filter 250 depending on the operation mode. For example, when connected to the DAC 220 and the bandlimiting filter 250 via the operation mode switcher 230, the buffer amplifier 240 drives the bandlimiting filter at a high speed. That is, the buffer amplifier 240 quickly charges a capacitor included in the bandlimiting filter 250.

The bandlimiting filter 250 is connected to the operation mode switcher 230. More specifically, the bandlimiting filter 250 may or may not be connected to the DAC 220, the buffer amplifier 240, and the VCO 110 depending on the operation mode. For example, when connected to the VCO 110 via the operation mode switcher 230, the bandlimiting filter 250 filters the analog control signal 14 to limit the frequency band of the analog control signal 14. The bandlimiting filter 250 thus generates a signal with the first control voltage 15. The bandlimiting filter 250 includes at least a capacitor. By limiting the frequency band of the analog control signal 14, the bandlimiting filter 250 allows the operation of the VCO 110, which is sensitive to disturbance, to be stabilized.

The operation mode of the frequency tuning circuit 200 and the operation mode switcher 230 will be described below in detail.

The frequency tuning circuit 200 has the first to third operation modes. First, the digital gain controller 210 generates an operation mode switching signal 13 indicative of switching to the first operation mode, and supplies the operation mode switching signal 13 to the register 213 and the operation mode switcher 230. In the first operation mode, when the frequency of the target signal is detected to be locked to the frequency of the reference signal 10, the digital gain controller 230 generates an operation mode switching signal 13 indicative of switching to the second operation mode, and supplies the operation mode switching signal 13 to the register 213 and the operation mode switcher 230. Locking of the target signal to the reference signal 10 may be detected based on, for example, the condition that the frequency error between the target signal and the reference signal 10 falls within a certain range. Moreover, in the second operation mode, when the frequency of the target signal is detected to be locked to the frequency of the reference signal 10, the digital gain controller 230 generates an operation mode switching signal 13 indicative of switching to the third operation mode, and supplies the operation mode switching signal 13 to the register 213 and the operation mode switcher 230. Basically, the third operation mode subsequently continues.

Figure 3A:
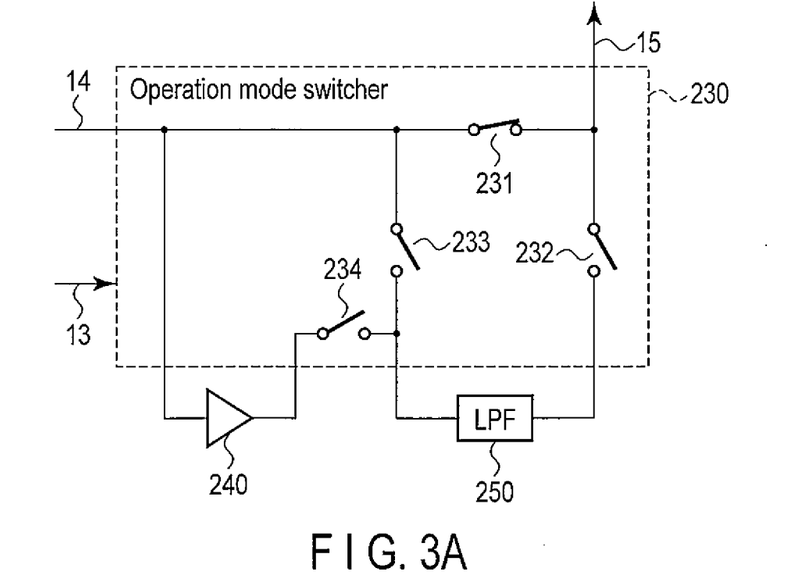
FIG. 3A is a diagram illustrating a first operation mode of a frequency tuning circuit shown in FIG. 1.
Figure 3B:
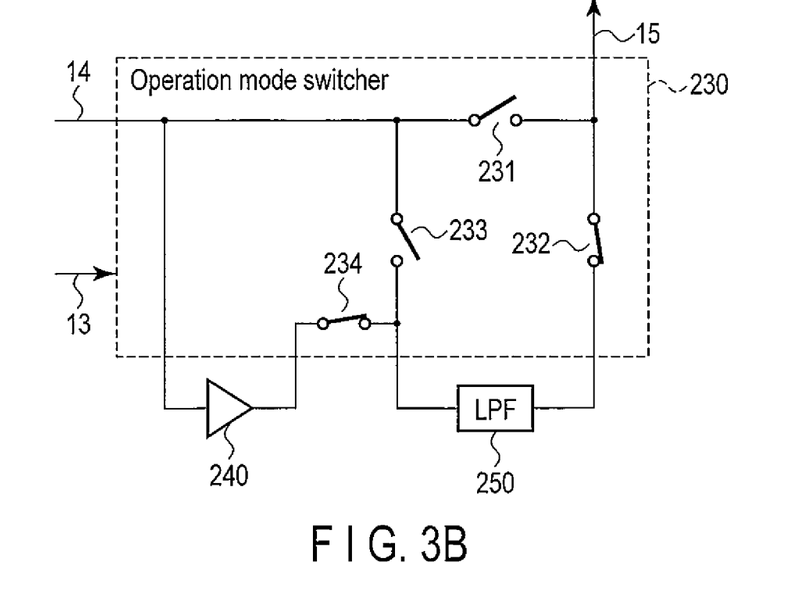
FIG. 3B is a diagram illustrating a second operation mode of the frequency tuning circuit shown in FIG. 1.
Figure 3C:
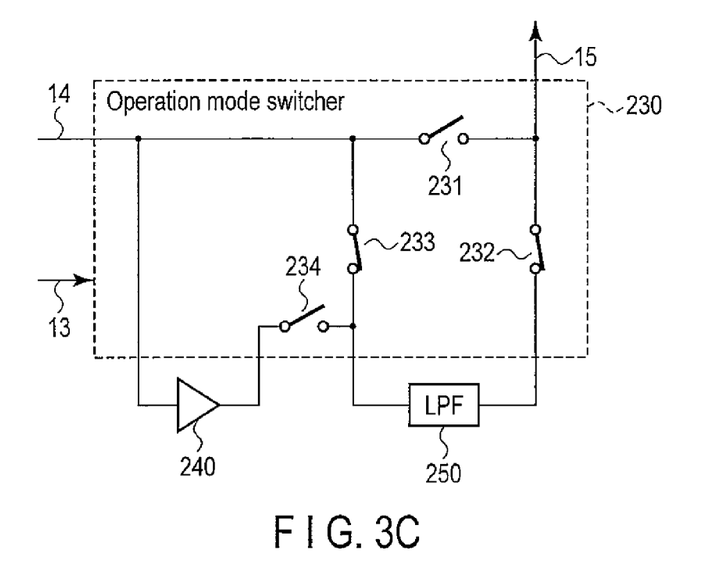
FIG. 3C is a diagram illustrating a third operation mode of the frequency tuning circuit shown in FIG. 1.

As shown in FIG. 3A, FIG. 3B, and FIG. 3C, the operation mode switcher 230 includes four switches 231, 232, 233, and 234. The switch 231 causes a short circuit or an open circuit between the output terminal of the DAC 220 and the first control terminal of the VCO 110. The switch 232 causes a short circuit or an open circuit between an output terminal of the bandlimiting filter 250 and the first control terminal of the VCO 110. The switch 233 causes a short circuit or an open circuit between the output terminal of the DAC 220 and an input terminal of the bandlimiting filter 250. The switch 234 causes a short circuit or an open circuit between an output terminal of the buffer amplifier 240 and the input terminal of the bandlimiting filter 250. FIG. 3A, FIG. 3B, and FIG. 3C are only illustrative. The operation mode switcher 230 may be any functional unit that can realize the connection state in each of the operation modes described below.

As shown in FIG. 3A, in the first operation mode, the switch 231 is on, and the switches 232, 233, and 234 are off. That is, in the first operation mode, the output terminal of the DAC 220 is connected to the first control terminal of the VCO 110 to supply the analog control signal 14 to the VCO 110 as a signal with the control voltage 15. In the first operation mode, the bandlimiting filter 250 is disabled, allowing the frequency tuning circuit 200 to achieve a quick lockup. As described above, at the end of the first operation mode, the digital control code output by the digital gain controller 212 is saved to the register 213.

As shown in FIG. 3B, in the second operation mode, the switches 231 and 233 are off, and the switches 232 and 234 are on. That is, in the second operation mode, the output terminal of the DAC 220 is connected to the first control terminal of the VCO 110 via the buffer amplifier 240 and the bandlimiting filter 250. The buffer amplifier 240 drives the bandlimiting filter 250 at a high speed. An output signal from the bandlimiting filter 250 is supplied to the VCO 110 as a signal with the first control voltage 15. In the second operation mode, the bandlimiting filter 250 is driven at a high speed by the buffer amplifier 240, thus allowing the frequency tuning circuit 200 to achieve a quick lockup regardless of a time constant for the bandlimiting filter 250.

As shown in FIG. 3C, in the third operation mode, the switches 231 and 234 are off, and the switches 232 and 233 are on. That is, in the third operation mode, the output terminal of the DAC 220 is connected to the first control terminal of the VCO 110 via the bandlimiting filter 250. Namely, the buffer amplifier 240 is disabled. As described above, at the beginning of the third operation mode, the DAC 220 converts the digital control code saved to the register 213 at the end of the first operation mode, into an analog control signal.

In the second operation mode, the buffer amplifier 240 operates to drive the bandlimiting filter 250 at a high speed. This reduces lockup time. On the other hand, the buffer amplifier 240 generates an offset voltage.

Here, in the first operation mode and the second operation mode, a first control voltage obtained when the frequency of the target signal is locked to the frequency of the reference signal 10 is denoted by $V_{LOCK}$. The offset voltage of the buffer amplifier 240 is denoted by $V_{OS}$. Furthermore, the digital control code corresponding to the voltage ($=V_{LOCK}$) is denoted by $D_{LOCK}$. The digital control code corresponding to the voltage ($=V_{OS}$) is denoted by $D_{OS}$.

At the end of the second operation mode, an output voltage from the bandlimiting filter 250 is also $V_{LOCK}$. In view of the offset voltage ($V_{OS}$) of the buffer amplifier 240, the control voltage of the analog control signal 14 is not $V_{LOCK}$ but $V_{LOCK}+V_{OS}$. The digital control code corresponding to the control voltage is $D_{LOCK}+D_{OS}$. That is, when, in this state, the operation mode is switched to the third one, the analog control signal 14 is input to the bandlimiting filter 250. Hence, the first control voltage 15 drifts to $V_{LOCK}+V_{OS}$, resulting in increased frequency error. Thus, at the beginning of the third operation mode, the register 213 resets the digital control code 12 ($=D_{LOCK}+D_{OS}$) to the digital control code 12 ($=D_{LOCK}$) saved at the end of the first operation mode. As a result, the control voltage of the analog control signal 14 is set to $V_{LOCK}$. That is, in the third operation mode, the offset voltage is ideally cancelled, and thus no frequency error occurs, maintaining the locked state.

As described above, the frequency tuning circuit included in the phase-locked loop circuit according to the first embodiment has the first to third operation modes. In the first operation mode, the bandlimiting filter is disabled, and a locking operation is performed, with the digital control code stored. In the second operation mode, the bandlimiting filter is enabled and driven at a high speed by the buffer amplifier. In the third operation mode, the digital control code stored in the first operation mode is utilized to cancel the offset voltage of the buffer amplifier. That is, the phase-locked loop circuit allows the buffer amplifier to drive the bandlimiting filter at a high speed in the second operation mode, and avoids a possible frequency error caused by the offset voltage of the buffer amplifier. Thus, the phase-locked loop circuit enables a quick lockup even if the VCO used is sensitive to disturbance. That is, the frequency tuning circuit locks up the frequency of the target signal to the frequency of the reference signal within the range of frequency errors determined by the resolution of the digital frequency detector. The phase tuning circuit then fine-tunes the frequency and pulls in the phase, thus enabling the phase-locked loop circuit to achieve a quick lockup.

(Second Embodiment)

Figure 4A:
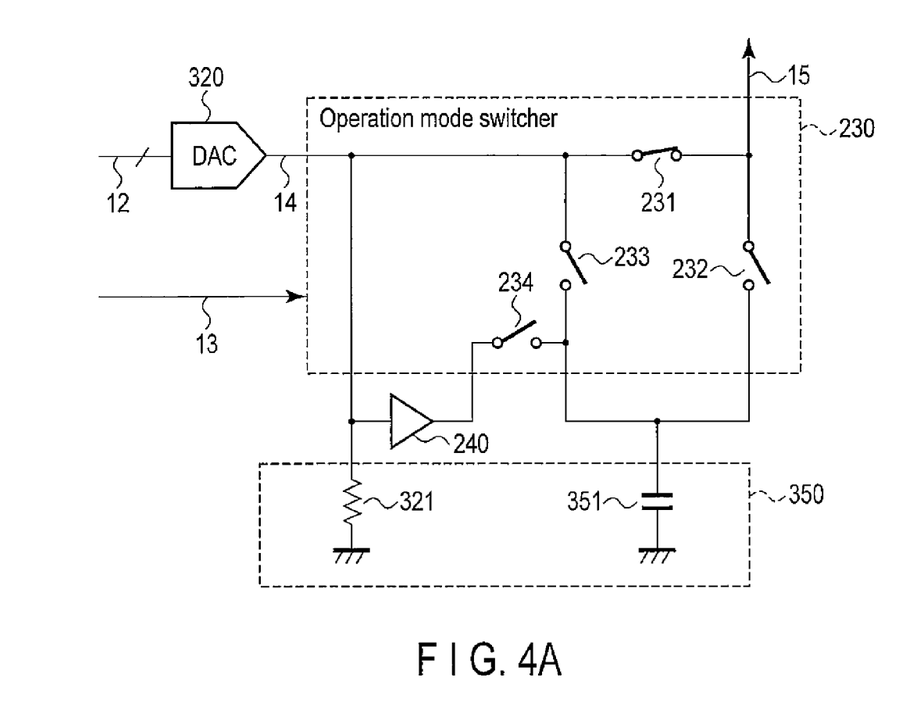
FIG. 4A is a diagram illustrating a first operation mode of a frequency tuning circuit according to a second embodiment.
Figure 4B:
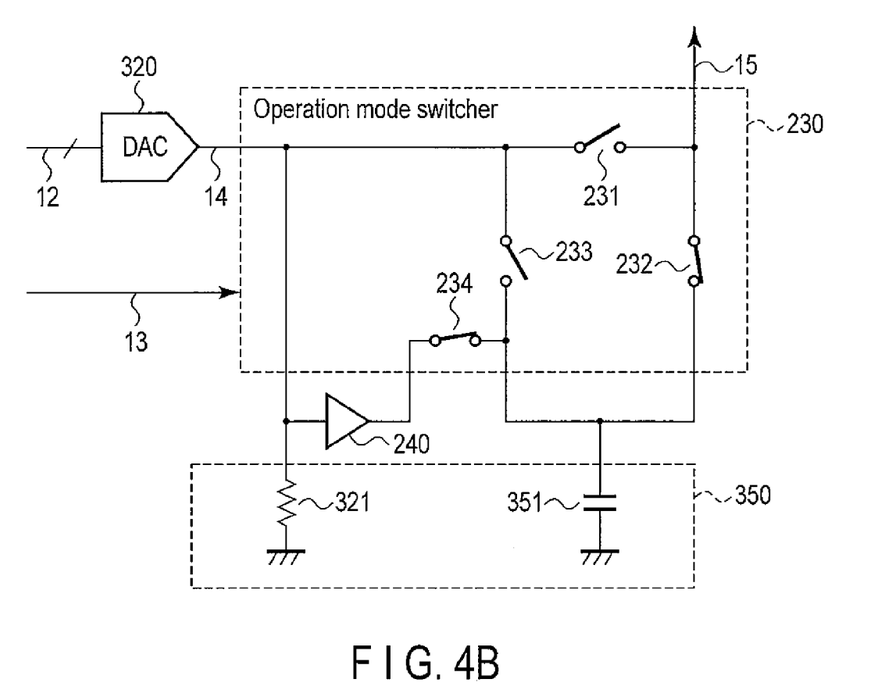
FIG. 4B is a diagram illustrating a second operation mode of the frequency tuning circuit according to the second embodiment.
Figure 4C:
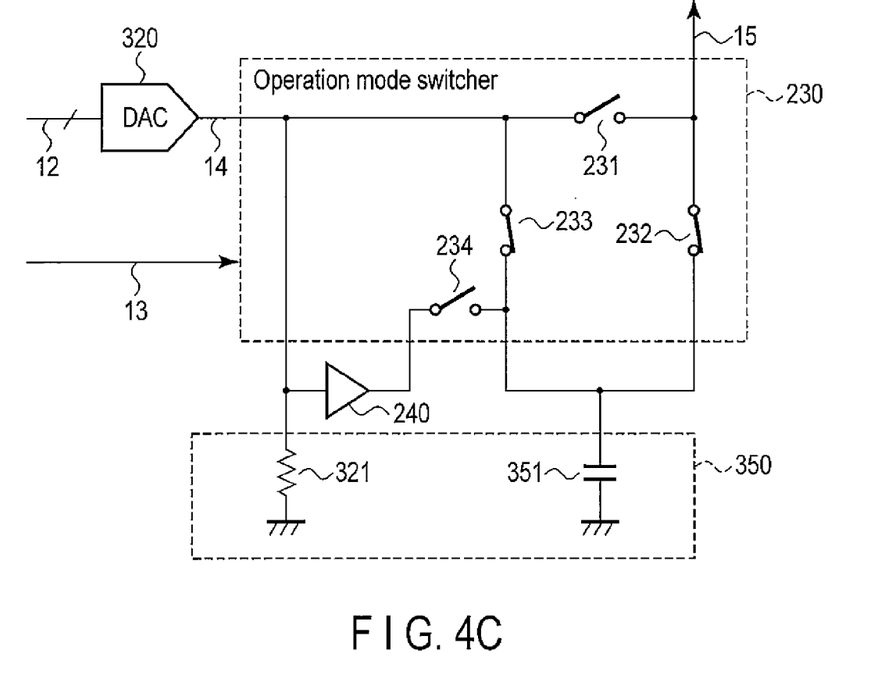
FIG. 4C is a diagram illustrating a third operation mode of the frequency tuning circuit according to the second embodiment.

A phase-locked loop circuit according to a second embodiment includes a frequency tuning circuit 300 that is different from the frequency tuning circuit 200. The frequency tuning circuit 300 includes a digital controller 210, DAC 320, a load resistor 321, an operation mode switcher 230, a buffer amplifier 240, and a capacitor 351.

DAC 320 is typically a current-output DAC (for example, a current steering DAC). The load resistor 321 is connected to an output terminal of DAC 320. An output current from DAC 320 is converted into a voltage by the load resistor 321. Thus, the above-described analog control signal 14 with a control voltage is obtained.

The capacitor 351, together with the load resistor 321, forms a bandlimiting filter 350. That is, the bandlimiting filter 350 shares the load resistor 321 with DAC 320. Sharing of the load resistor 321 allows the omission or size reduction of the resistor independently used by the bandlimiting filter 350. This enables a reduction in the area of the frequency tuning circuit 300 and in possible noise in the frequency tuning circuit 300.

The operation modes of the frequency tuning circuit 300 will be described below with reference to FIG. 4A, FIG. 4B, and FIG. 4C.

The frequency tuning circuit 300 also has a first operation mode to a third operation mode which are similar to those in the first embodiment. The switch 232 in the operation mode switcher 230 causes a short circuit or an open circuit between one end (plus terminal) of the capacitor 351 and the first control terminal of the VCO 110. The switch 234 causes a short circuit or an open circuit between the output terminal of the buffer amplifier 240 and the one end (plus terminal) of the capacitor 351. FIG. 4A, FIG. 4B, and FIG. 4C are only illustrative. The operation mode switcher 230 may be any functional unit that can realize the connection state in each of the operation modes.

As shown in FIG. 4A, in the first operation mode, the switch 231 is on, and the switches 232, 233, and 234 are off. That is, in the first operation mode, the output terminal of DAC 320 is connected to the first control terminal of the VCO 110. The analog control signal 14 is supplied to the VCO 110 as a signal with the first control voltage 15. In the first operation mode, the bandlimiting filter 350 is disabled. The DAC 320 merely drives the load resistor 321. Thus, the frequency tuning circuit 300 can achieve a quick lockup. As is the case with the above-described first embodiment, at the end of the first operation mode, the digital control code output by the digital gain controller 212 is saved to the register 213.

As shown in FIG. 4B, in the second operation mode, the switches 231 and 233 are off, and the switches 232 and 234 are on. That is, in the second operation mode, an output terminal of DAC 320 is connected to the first control terminal of the VCO 110 via the buffer amplifier 240 and the bandlimiting filter 350. The buffer amplifier 240 drives the bandlimiting filter 350 at a high speed. An output signal from the bandlimiting filter 350 is supplied to the VCO 110 as a signal with the first control voltage 15. That is, the buffer amplifier 240 quickly charges the capacitor 351 so as to make the voltage of the plus terminal of the capacitor 351 equal to the first control voltage ($=V_{LOCK}$) for lockup. In the second operation mode, the bandlimiting filter 350 is driven at a high speed by the buffer amplifier 240, thus allowing the frequency tuning circuit 300 to achieve a quick lockup regardless of a time constant for the bandlimiting filter 350.

As shown in FIG. 4C, in the third operation mode, the switches 231 and 234 are off, and the switches 232 and 233 are on. That is, in the third operation mode, the output terminal of DAC 320 is connected to the first control terminal of the VCO 110 via the bandlimiting filter 350. That is, the buffer amplifier 240 is disabled. As described above, at the beginning of the third operation mode, the DAC 320 performs a digital-to-analog conversion to convert the digital control code saved to the register 213 at the end of the first operation mode, into an analog control signal.

As described above, the frequency tuning circuit included in the phase-locked loop circuit according to the second embodiment has the first to third operation modes, which are similar to those in the above-described first embodiment. Thus, the phase-locked loop circuit produces effects similar to those of the first embodiment. Moreover, the phase-locked loop circuit uses the load resistor for the DAC as an element of the bandlimiting filter. Therefore, the phase-locked loop circuit enables a reduction in the area of the frequency tuning circuit and in possible noise in the frequency tuning circuit.

(Third Embodiment)

Figure 5:
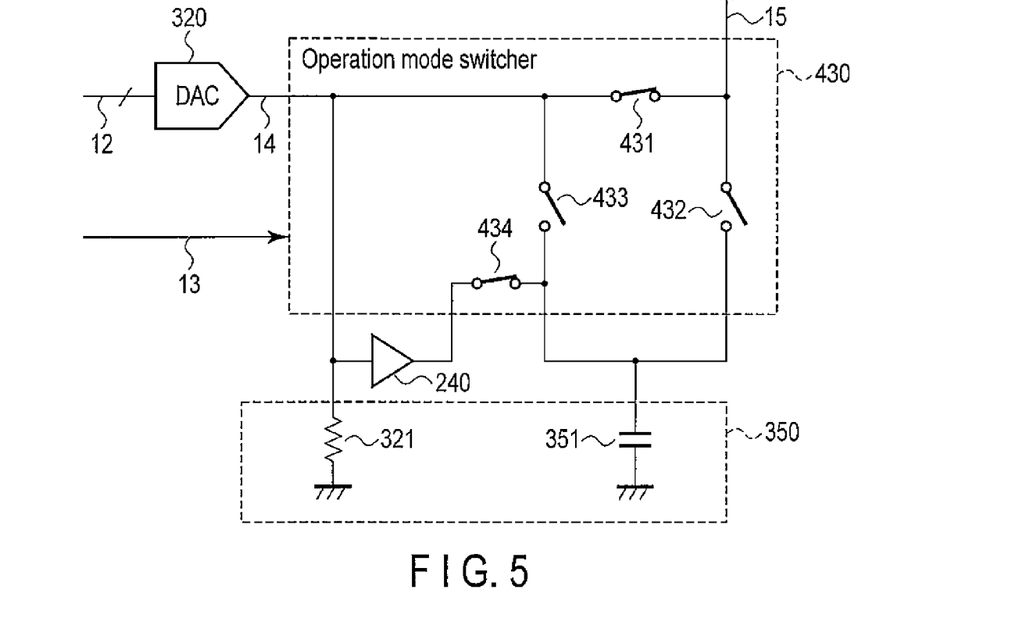
FIG. 5 is a diagram illustrating a first operation mode of a frequency tuning circuit according to a third embodiment.

A phase-locked loop circuit according to a third embodiment includes a frequency tuning circuit 400 that is different from each of the frequency tuning circuits 200 and 300. The frequency tuning circuit 400 is basically similar to each of the frequency tuning circuits 200 and 300 but is different from each of these frequency tuning circuits in the first operation mode.

The frequency tuning circuit 400 includes, for example, the digital controller 210, DAC 320, the load resistor 321, an operation mode switcher 430, the buffer amplifier 240, and the capacitor 351. The operation mode switcher 430 includes switches 431, 432, 433, and 434 arranged in the same manner as that in which the switches 231, 232, 233, and 234 are arranged. In the second and third operation modes, the ON/OFF state of the switches 431, 432, 433, and 434 is the same as that of switches 231, 232, 233, and 234.

As shown in FIG. 5, in the first operation mode, the switches 431 and 434 are on, and the switches 432 and 433 are off. That is, in the first operation mode, the output terminal of DAC 320 is connected to the first control terminal of the VCO 110 and to the input terminal of the buffer amplifier 240. The analog control signal 14 is supplied to the VCO 110 as a signal with the first control voltage 15, and the buffer amplifier 240 pre-charges the capacitor 351. Thus, the second operation mode is started with the capacitor 351 pre-charged (for example, the pre-charging sets the voltage of the plus terminal of the capacitor 351 to $V_{LOCK}-V_{OS}$). As in the case with the first and second embodiments, at the end of the first operation mode, a digital control code output by the digital gain controller 212 is saved to the register 213. FIG. 5 is only illustrative. The operation mode switcher 430 may be any functional unit that can realize the connection state in each of the operation modes.

As described above, the phase-locked loop circuit according to the third embodiment is different from each of the first and second embodiments in the first operation mode of the frequency tuning circuit. Specifically, in the first operation mode, the buffer amplifier pre-charges the capacitor included in the bandlimiting filter. Therefore, the phase-locked loop circuit reduces the time required for the second operation mode, enabling a much quicker lockup.

(Fourth Embodiment)

Figure 6:
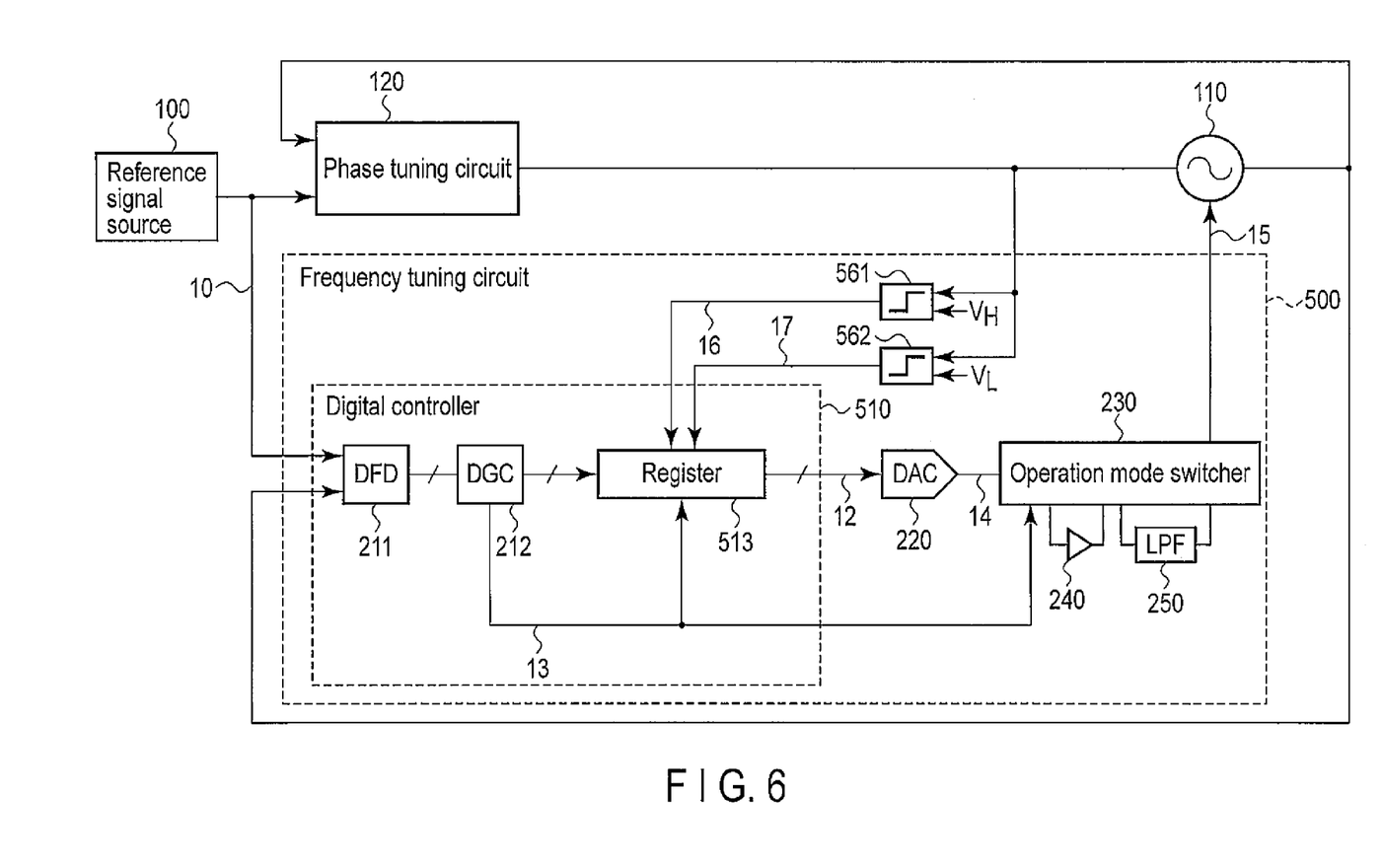
FIG. 6 is a block diagram illustrating a phase-locked loop circuit according to a fourth embodiment.

As shown in FIG. 6, a phase-locked loop circuit according to a fourth embodiment includes the reference signal source 100, the VCO 110, the phase tuning circuit 120, and a frequency tuning circuit 500.

The frequency tuning circuit 500 includes a digital controller 510, the DAC 220, the operation mode switcher 230, the buffer amplifier 240, the bandlimiting filter 250, and comparators 561 and 562. The frequency tuning circuit 500 may or may not have a first operation mode to a third operation mode which are identical or similar to those in any of the first to third embodiments. The frequency tuning circuit 500 may lock at least the frequency of the target signal to the frequency of the reference signal 10. The digital controller 510 includes the digital frequency detector 211, the digital gain controller 212, and a register 513.

Comparator 561 compares a second control voltage ($=V_{Ctl}$) provided to the second control terminal of the VCO 110 by the phase tuning circuit 120 with a first threshold ($=V_H$) after a lockup in the frequency tuning circuit 500 (for example, during the third operation mode). If the second control voltage is higher than the first threshold voltage, comparator 561 supplies the register 513 with an UP signal 16 at a high level.

Comparator 562 compares the second control voltage ($=V_{Ctl}$) with a second threshold voltage ($=V_L$) after a lockup in the frequency tuning circuit 500 (for example, during the third operation mode). The second threshold voltage is lower than the first threshold voltage. If the second control voltage is lower than the second threshold voltage, comparator 562 supplies the register 513 with a DN signal 17 at a high level. The first and second threshold voltages can be set based on the phase pull-in range of the phase tuning circuit 120.

After a lockup in the frequency tuning circuit 500 (for example, during the third operation mode), the register 513 supplies the digital control code (for example, $D_{LOCK}$) 12 to the DAC 220. The register 513 increases and reduces this value in accordance with the UP signal 16 and the DN signal 17. Specifically, when the UP signal 16 at the high level is input to the register 513, which then increments the digital control code 12 (for example, by one). On the other hand, when the DN signal 17 at the high level is input to the register 513, which then decrements the digital control code 12 (for example, by one).

Figure 7:
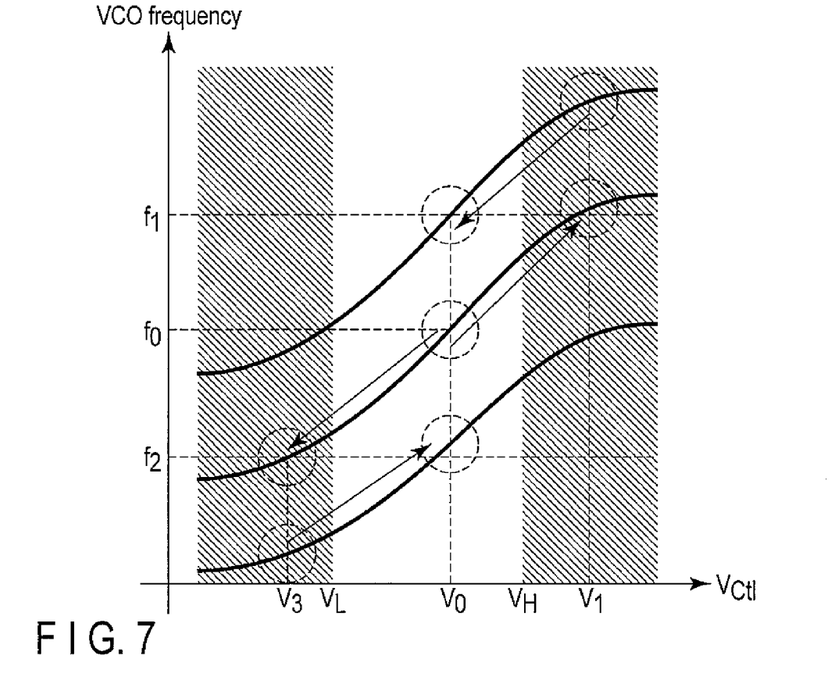
FIG. 7 is a diagram illustrating operation of the phase-locked loop circuit in FIG. 6.

The technical significance of adjustment of the digital control code 12 in accordance with the UP signal 16 and the DN signal 17 will be described below with reference to FIG. 7.

The frequency tuning circuit 500 is designed such that when a lockup is achieved, the second control voltage is equal to a value (for example, $V_0$) close to the center of the phase pull-in range (frequency tunable range) of the phase tuning circuit 120. However, for example, an unexpected disturbance, an offset drift of the buffer amplifier 240, or the like may cause a frequency error resulting from a lockup achieved by the frequency tuning circuit 500 to exceed the phase pull-in range of the phase tuning circuit 120.

For example, it is assumed that the frequency of the oscillation signal 11 obtained when the phase tuning circuit 120 sets the second control voltage to $V_0$ after a lockup achieved by the frequency tuning circuit 500 is denoted by $f_0$ and that the frequency of the desired signal is denoted by $f_1$ ($>f_0$). In this case, the phase tuning circuit 120 needs to increase the second control voltage to $V_1$ in order to lock the frequency of the oscillation signal 11 to $f_1$. If $V_1$ is higher than a voltage corresponding to the upper limit of the phase pull-in range of the phase tuning circuit 120, the phase tuning circuit 120 cannot achieve locking. Thus, when the second control voltage becomes higher than $V_H$, comparator 561 outputs the UP signal 16 at the high level to increase the digital control code 12. The increased digital control code 12 raises the first control voltage and thus increases the frequency of the oscillation signal 11 even with the second control voltage unchanged. That is, a possible increase in second control voltage is suppressed to enable a lockup at a value less than or equal to $V_H$.

Furthermore, it is assumed that the frequency of the oscillation signal 11 obtained when the phase tuning circuit 120 sets the second control voltage to $V_0$ after a lockup achieved by the frequency tuning circuit 500 is denoted by $f_0$ and that the frequency of the desired signal is denoted by $f_2$ ($<f_0$). In this case, the phase tuning circuit 120 needs to reduce the second control voltage to $V_2$ in order to lock the frequency of the oscillation signal 11 to $f_2$. If $V_2$ is lower than a voltage corresponding to the lower limit of the phase pull-in range of the phase tuning circuit 120, the phase tuning circuit 120 cannot achieve locking. Thus, when the second control voltage becomes lower than $V_L$, comparator 562 outputs the DN signal 17 at the high level to reduce the digital control code 12. The reduced digital control code 12 lowers the first control voltage and thus reduces the frequency of the oscillation signal 11 even with the second control voltage unchanged. That is, a possible decrease in second control voltage is suppressed to enable a lockup at a value greater than or equal to $V_L$.

As described above, a frequency error can be reduced without the adjustment of the second control voltage by adjusting the digital control code 12 in accordance with the UP signal 16 and the DN signal 17. Thus, even if the frequency error is increased by unexpected disturbance, an offset drift of the buffer amplifier 240, or the like, the phase tuning circuit 120 can stably achieve a lockup to allow the second control voltage to fall within the range of at least $V_L$ and at most $V_H$.

As described above, the phase-locked loop circuit according to the fourth embodiment adjusts the digital control code in the frequency tuning circuit to be adjusted as required based on the control voltage from the phase tuning circuit. Adjustment of the digital control code reduces and sets the frequency error to within the range where the frequency error can be adjusted by the phase tuning circuit. Therefore, the phase-locked loop circuit enables a lockup even if the frequency error is increased by an unexpected disturbance, an offset drift of the buffer amplifier or the like.

(Fifth Embodiment)

Figure 8:
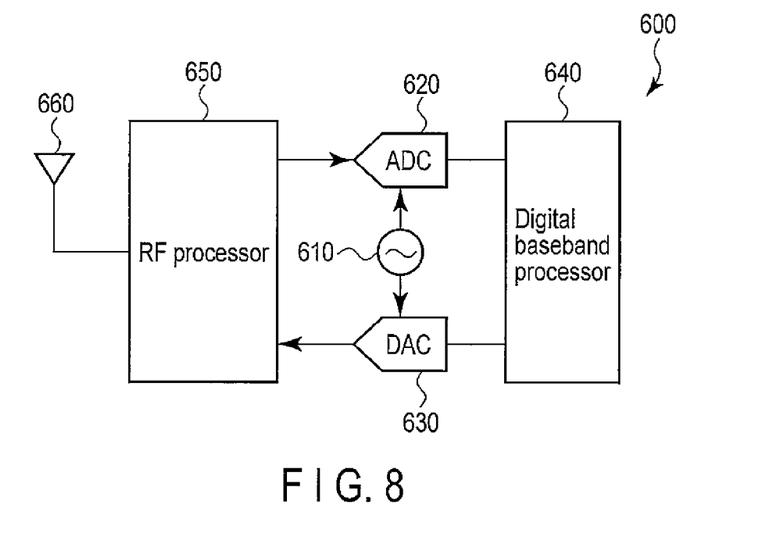
FIG. 8 is a block diagram illustrating a communication apparatus according to a fifth embodiment.

A communication apparatus according to a fifth embodiment can incorporate the phase-locked loop circuit according to any of the above-described first to fourth embodiments. A communication apparatus 600 according to the present embodiment is illustrated in FIG. 8. The communication apparatus 600 includes a phase-locked loop circuit 610, an analog-to-digital converter 620, a digital-to-analog converter 630, a digital baseband processor 640, an RF processor 650, and an antenna 660.

The phase-locked loop circuit 610 is a phase-locked loop circuit according to any of the first to fourth embodiments. The phase-locked loop circuit 610 subjects the analog-to-digital converter 620 and the digital-to-analog converter 630 to clock control. The clock control is performed using the above oscillation signal 11 generated by the VCO 110.

The digital baseband processor 640 carries out processing such as encoding and decoding. For example, in connection with transmission, the digital baseband processor 640 generates and outputs a digital transmission signal to the digital-to-analog converter 630. Furthermore, in connection with reception, the digital baseband processor 640 receives a digital reception signal input by the analog-to-digital converter 620.

The analog-to-digital converter 620 is subjected to clock control in accordance with the oscillation signal 11 from the phase-locked loop circuit 610. The analog-to-digital converter 620 receives a baseband reception signal from the RF processor 650 and converts the baseband reception signal into a digital reception signal. The analog-to-digital converter 620 outputs the digital reception signal to the digital baseband processor 640.

The digital-to-analog converter 630 is subjected to clock control in accordance with the oscillation signal 11 from the phase-locked loop circuit 610. The digital-to-analog converter 630 receives a digital transmission signal from the digital baseband processor 640 and converts the digital transmission signal into a broadband transmission signal. The digital-to-analog converter 630 outputs the baseband transmission signal to the RF processor 650.

The RF processor 650 carries out processing such as filtering, up-conversion, down-conversion, low-noise amplification, and power amplification. For example, in connection with transmission, the RF processor 650 processes a baseband transmission signal from the digital-to-analog converter 630 to obtain an RF transmission signal. The RF processor 650 then outputs the RF transmission signal to the antenna 660. Furthermore, in connection with reception, the RF processor 650 processes an RF reception signal from the antenna 660 to obtain a baseband reception signal. The RF processor 650 then outputs the baseband reception signal to the analog-to-digital converter 620.

The antenna 660 radiates an RF transmission signal from the RF processor 650 to space or outputs an RF reception signal to the RF processor 650.

As described above, the communication apparatus according to the fifth embodiment includes a phase-locked loop circuit according to any of the first to fourth embodiments. Therefore, the communication apparatus produces effects that are identical or similar to those of any of the above-described first to fourth embodiments. For example, lockup speed can be increased to reduce the time required for startup, improving the efficiency of data processing.

(Sixth Embodiment)

Figure 9:
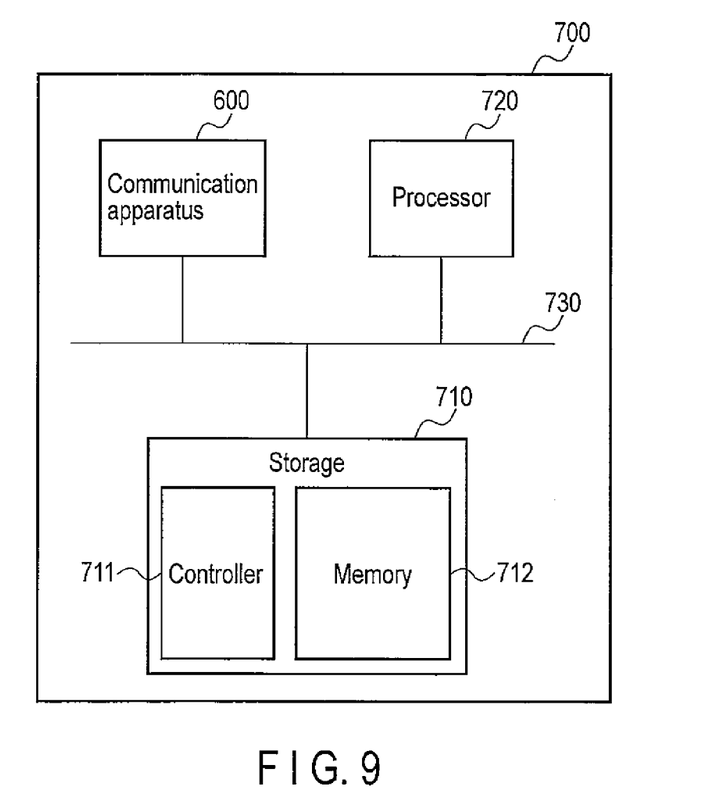
FIG. 9 is a block diagram illustrating a storage apparatus according to a sixth embodiment.

A storage apparatus according to a sixth embodiment can incorporate the communication apparatus according to the above-described fifth embodiment. A storage apparatus 700 according to the present embodiment is illustrated in FIG. 9. The storage apparatus 700 includes the communication apparatus 600, a storage 710, a processor 720, and a bus 730.

The communication apparatus 600 transmits data provided by the storage 710 or the processor 720, and receives and passes data to the storage 710 or the processor 720. The communication apparatus 600, the storage 710, and the processor 720 are connected together via the bus 730 and can transmit and receive data to and from one another.

The storage 710 includes a memory 712 that is, for example, a nonvolatile semiconductor memory, and a controller 711 which controls reading and writing carried out on the memory 712. The storage 710 stores data provided by the communication apparatus 600 or the processor 720. The storage 710 further reads and passes data to the communication apparatus 600 or the processor 720.

The processor 720 receives data from the communication apparatus 600 or the storage 710 and processes the data. The processor 720 may pass the processed data to the communication apparatus 600 or the storage 710.

As described above, the storage apparatus according to the sixth embodiment includes the communication apparatus according to the fifth embodiment. Therefore, the storage apparatus produces effects that are identical or similar to those of the above-described fifth embodiment. For example, the lockup speed can be increased to reduce the time required for startup, improving the efficiency of data processing.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A frequency tuning circuit which supports a first operation mode, a second operation mode, and a third operation mode, the circuit comprising:
   a voltage controlled oscillator which includes a first control terminal and outputs an oscillation signal which is controllable based on a first control voltage provided to the first control terminal;
   a digital frequency detector which detects a frequency error between a reference signal and a target signal obtained by dividing a frequency of the oscillation signal at a desired rate;
   a controller which adjusts again of the frequency error to generate a first digital control code;
   a register which outputs the first digital control code as a second digital control code in the first operation mode and the second operation mode, saves the first digital control code as a third digital control code at an end of the first operation mode, and outputs the third digital control code as the second digital control code at a beginning of the third operation mode;
   a digital-to-analog converter which converts the second digital control code into an analog control signal and outputs the analog control signal;
   a bandlimiting filter which filters the analog control signal to generate the first control voltage when connected to the first control terminal of the voltage controlled oscillator;
   a buffer amplifier which drives the bandlimiting filter when connected to the digital-to-analog converter and the bandlimiting filter; and
   a switcher which switches a state of connections among the digital-to-analog converter, the first control terminal of the voltage controlled oscillator, the bandlimiting filter, and the buffer amplifier, and
   wherein in the first operation mode, the digital-to-analog converter supplies the analog control signal with the first control voltage to the first control terminal of the voltage controlled oscillator,
   in the second operation mode, the digital-to-analog converter supplies the analog control signal to the buffer amplifier, the buffer amplifier drives the bandlimiting filter, and the bandlimiting filter generates the first control voltage, and
   in the third operation mode, the digital-to-analog converter supplies the analog control signal to the bandlimiting filter, and the bandlimiting filter generates the first control voltage.

2. The frequency tuning circuit according to claim 1, wherein the bandlimiting filter comprises a capacitor and a load resistor, and the load resistor is shared between the bandlimiting filter and the digital-to-analog converter,
   the switcher comprises a first switch configured to short circuit or open circuit a portion between an output terminal of the digital-to-analog converter and the first control terminal of the voltage controlled oscillator, a second switch configured to short circuit or open circuit a portion between one end of the capacitor and the first control terminal of the voltage controlled oscillator, a third switch configured to short circuit or open circuit a portion between the output terminal of the digital-to-analog converter and the one end of the capacitor, and a fourth switch configured to short circuit or open circuit a portion between an output terminal of the buffer amplifier and the one end of the capacitor,
   in the first operation mode, the switcher turns on the first switch and turns off the second switch and the third switch,
   in the second operation mode, the switcher turns off the first switch and the third switch and turns on the second switch and the fourth switch, and
   in the third operation mode, the switcher turns off the first switch and the fourth switch and turns on the second switch and the third switch.

3. The frequency tuning circuit according to claim 2, wherein in the first operation mode, the switcher further turns on the fourth switch, the digital-to-analog converter further supplies the analog control signal to the buffer amplifier, and the buffer amplifier charges the capacitor.

4. A phase-locked loop circuit comprising:
   the frequency tuning circuit according to claim 1; and
   a phase tuning circuit which operates after the frequency tuning circuit locks a frequency of the target signal to a frequency of the reference signal, and wherein the voltage controlled oscillator further comprises a second control terminal, the oscillation signal is controllable based on the first control voltage and a second control voltage provided to the second control terminal, and the phase tuning circuit generates the second control voltage and locks a phase of the target signal to a phase of the reference signal.

5. The phase-locked loop circuit according to claim 4, wherein the frequency tuning circuit further comprises:

a first comparator which compares the second control voltage with a first threshold voltage and outputs a first tuning signal to the register if the second control voltage is higher than the first threshold voltage; and a second comparator which compares the second control voltage with a second threshold voltage lower than the first threshold voltage and outputs a second tuning signal to the register if the second control voltage is lower than the second threshold voltage, and the resistor increases a second digital control code upon receiving the first tuning signal and reduces the second digital control code upon receiving the second tuning signal.

6. A communication apparatus comprising:

the phase-locked loop circuit according to claim 4;

a digital-to-analog converter which is subjected to clock control in accordance with the oscillation signal to convert a digital transmission signal into a baseband transmission signal;

an analog-to-digital converter which is subjected to clock control in accordance with the oscillation signal to convert a baseband reception signal into a digital reception signal;

a digital baseband processor which processes the digital transmission signal and the digital reception signal; and an RF processor which processes the baseband transmission signal and the baseband reception signal.

7. A storage apparatus comprising:

the communication apparatus according to claim 6 which transmits and receives data;

a storage which comprises a memory and a controller configured to control reading and writing carried out on the memory to read and write the data;

a processor which processes the data; and a bus which connects the communication apparatus, the storage, and the processor together.

* * * * *